United States Patent
Gill

(10) Patent No.: US 7,616,411 B2
(45) Date of Patent: Nov. 10, 2009

(54) CURRENT PERPENDICULAR TO PLANE (CPP) MAGNETORESISTIVE SENSOR HAVING A FLUX GUIDE STRUCTURE AND SYNTHETIC FREE LAYER

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 621 days.

(21) Appl. No.: 11/392,199

(22) Filed: Mar. 28, 2006

(65) Prior Publication Data

US 2007/0230066 A1 Oct. 4, 2007

(51) Int. Cl.
*G11B 5/39* (2006.01)
*G11B 5/127* (2006.01)

(52) U.S. Cl. .................. 360/324.12; 360/321; 360/322
(58) Field of Classification Search ................ 360/321, 360/322, 324–324.2
See application file for complete search history.

(56) References Cited

U.S. PATENT DOCUMENTS

| | | | |
|---|---|---|---|
| 5,898,547 A * | 4/1999 | Fontana et al. ........... 360/324.2 |
| 6,486,662 B1 * | 11/2002 | Ruigrok et al. ............. 324/252 |
| 6,542,343 B1 * | 4/2003 | Gill ......................... 360/324.2 |
| 6,597,546 B2 * | 7/2003 | Gill ............................ 360/321 |
| 6,631,055 B2 * | 10/2003 | Childress et al. ............. 360/321 |
| 6,636,391 B2 * | 10/2003 | Watanabe et al. ........... 360/321 |
| 6,680,827 B2 * | 1/2004 | Li et al. ...................... 360/314 |
| 6,680,830 B2 * | 1/2004 | Gill ............................ 360/321 |
| 6,724,587 B2 * | 4/2004 | Gill ......................... 360/324.2 |
| 6,888,705 B2 * | 5/2005 | Fontana et al. ......... 360/324.12 |
| 7,161,773 B2 * | 1/2007 | Fontana et al. ........... 360/324.1 |
| 2001/0040777 A1 * | 11/2001 | Watanabe et al. ........... 360/321 |
| 2002/0067580 A1 * | 6/2002 | Li et al. ....................... 360/321 |
| 2002/0135949 A1 | 9/2002 | Gill ......................... 360/324.2 |
| 2002/0154452 A1 | 10/2002 | Gill ............................ 360/321 |

(Continued)

FOREIGN PATENT DOCUMENTS

JP 10011721 A * 1/1998

(Continued)

OTHER PUBLICATIONS

English-machine translation of JP 2003-077107 A to Ishii, published on Mar. 14, 2003.*

*Primary Examiner*—William J Klimowicz
(74) *Attorney, Agent, or Firm*—Zilka-Kotab, PC

(57) ABSTRACT

A current perpendicular to plane (CPP) magnetoresistive sensor having a front edge that is recessed from the air bearing surface (ABS). The sensor includes a pinned layer structure a free layer structure and a spacer layer sandwiched between the free layer and the pinned layer. The free layer is an AP coupled structure that includes a first magnetic layer F1 a second magnetic layer F2 and a coupling layer sandwiched between F1 and F2. The first magnetic layer F1 extends to the ABS while the other sensor layers terminate at the recessed front edge. In this way, the F1 layer acts as a flux guide that reacts to a magnetic field from a magnetic medium. The AP coupled structure of the free layer allows each magnetic layer F1 and F2 to be thicker than would be possible in a conventional single layer free layer, which increases the GMR effect of the sensor and increases the effectiveness of the flux guide (F2).

24 Claims, 4 Drawing Sheets

U.S. PATENT DOCUMENTS

| | | | |
|---|---|---|---|
| 2002/0167766 A1* | 11/2002 | Hayashi | 360/324.2 |
| 2002/0186514 A1* | 12/2002 | Childress et al. | 360/324.2 |
| 2003/0048584 A1* | 3/2003 | Song et al. | 360/319 |
| 2003/0137780 A1* | 7/2003 | Fontana et al. | 360/324.2 |
| 2003/0151857 A1 | 8/2003 | Kishi | 360/321 |
| 2003/0189797 A1 | 10/2003 | Arai et al. | 360/321 |
| 2003/0193758 A1 | 10/2003 | Hiramoto et al. | 360/321 |
| 2005/0152074 A1* | 7/2005 | Yuasa et al. | 360/322 |

FOREIGN PATENT DOCUMENTS

JP 2003077107 A * 3/2003

* cited by examiner

CURRENT PERPENDICULAR TO PLANE (CPP) MAGNETORESISTIVE SENSOR HAVING A FLUX GUIDE STRUCTURE AND SYNTHETIC FREE LAYER

FIELD OF THE INVENTION

The present invention relates to magnetoresistive sensors and more particularly to a current perpendicular to plane giant magnetoresistive sensor (CPP GMR) having a recessed front edge to prevent smearing at the ABS and an AP coupled free layer with a flux guide for improved GMR performance.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head, a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

The ever increasing demand for increased data rate and data capacity has lead a relentless push to develop magnetoresistive sensors having improved signal amplitude. Sensors that show promise in achieving higher signal amplitude are current perpendicular to plane (CPP) sensors. Such sensors conduct sense current from top to bottom, perpendicular to the planes of the sensor layers. An examples of CPP sensor includes current perpendicular to plane giant magnetoresistive sensors (CPP GMR sensors). A CPP GMR sensor operates based on the spin dependent scattering of electrons through the sensor, similar to a more traditional CIP GMR sensor except that, as mentioned above, the sense current flows perpendicular to the plane of the layers.

One challenge presented by such CPP sensors is that shorting of sense current may occur at the air bearing surface (ABS). This shunting of sense current seriously degrades sensor performance. This shunting can occur as a result of smearing of the sense layers at the ABS. As those skilled in the art will appreciate, a lapping procedure is generally used to form the ABS. This lapping procedure can cause material from the free and/or pinned layers to smear across the spacer layer.

In addition, it is desired that the performance of the sensor in the form of dr/R be as high as possible. The dr/R of the sensor is proportional to the thickness of the free layer as well as the reference or pinned layer. However, the thickness of the free layer is limited by the need to maintain high utilization/sensitivity so that the free layer will remain sensitive to a magnetic field. Therefore, the free layer is limited to a thickness of about 30 Angstroms. There is also a need to lower the magnetic noise for future narrow track width sensors, this noise increases as sensor volume decreases.

Therefore, there is a need for a sensor design that avoids the shunting of sense current at the ABS. Such a sensor would also preferably maximize dr/R performance, such as by increasing the thickness of the free layer, and would be as sensitive as possible to a magnetic field such as from a magnetic medium.

SUMMARY OF THE INVENTION

The present invention provides a current perpendicular to plane giant magnetoresistive sensor (CPP GMR) having an air bearing surface (ABS) and a front edge that is recessed from the ABS. The sensor includes free layer structure, a pinned layer structure and a non-magnetic spacer layer sandwiched between the free and pinned layer structures. The free layer is an antiparallel coupled, synthetic free layer structure having first and second magnetic layers that are antiparallel coupled across a coupling layer. The first magnetic layer extends beyond the recessed front edge of the sensor to the ABS.

The first magnetic layer, which extends to the ABS, acts as a flux guide to respond to a magnetic field from a magnetic medium. As the magnetization of the first magnetic layer of the free layer rotates in response to a magnetic field, the second layer moves the same amount in an opposite (antiparallel) direction.

Constructing the free layer as an AP coupled structure advantageously allows each of the magnetic layers of the free layer to be constructed thicker than the entire free layer would be in a simple single layer structure. This is because the effective free layer thickness for purposes of utilization/sensitivity is the difference between the thicknesses of the two layers. This allows the layer adjacent to the spacer layer (ie. the second magnetic layer) to be thicker, resulting in increased GMR effect dr/R. It also allows the flux guide magnetic layer (first magnetic layer) to be thicker, making it a more efficient flux guide. In addition, the synthetic free layer provides lower magnetic noise due to its larger volume and stiffness.

The first magnetic layer (flux guide layer) can be constructed of a material including CoX wherein X is B, Si, Nb or Mo. Constructing the first magnetic layer of such a material kills the subtractive GMR effect that would otherwise be experienced with such an AP couple free layer structure.

Recessing the bulk of the sensor away from the ABS advantageously prevents smearing/damage at the ABS during lapping when forming the ABS. This prevents sense current from being shorted across the spacer layer, thereby improving sensor performance and reliability.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
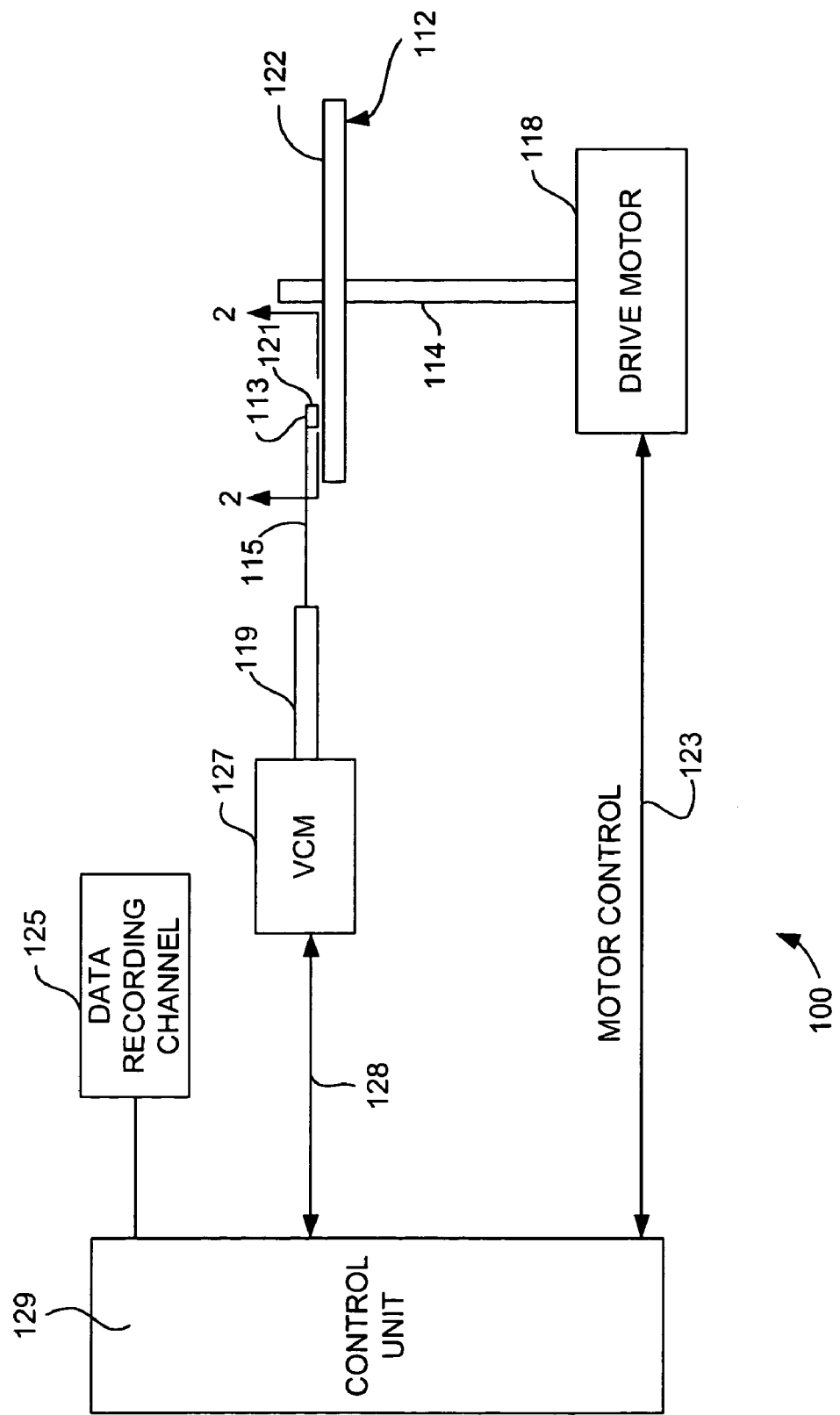
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
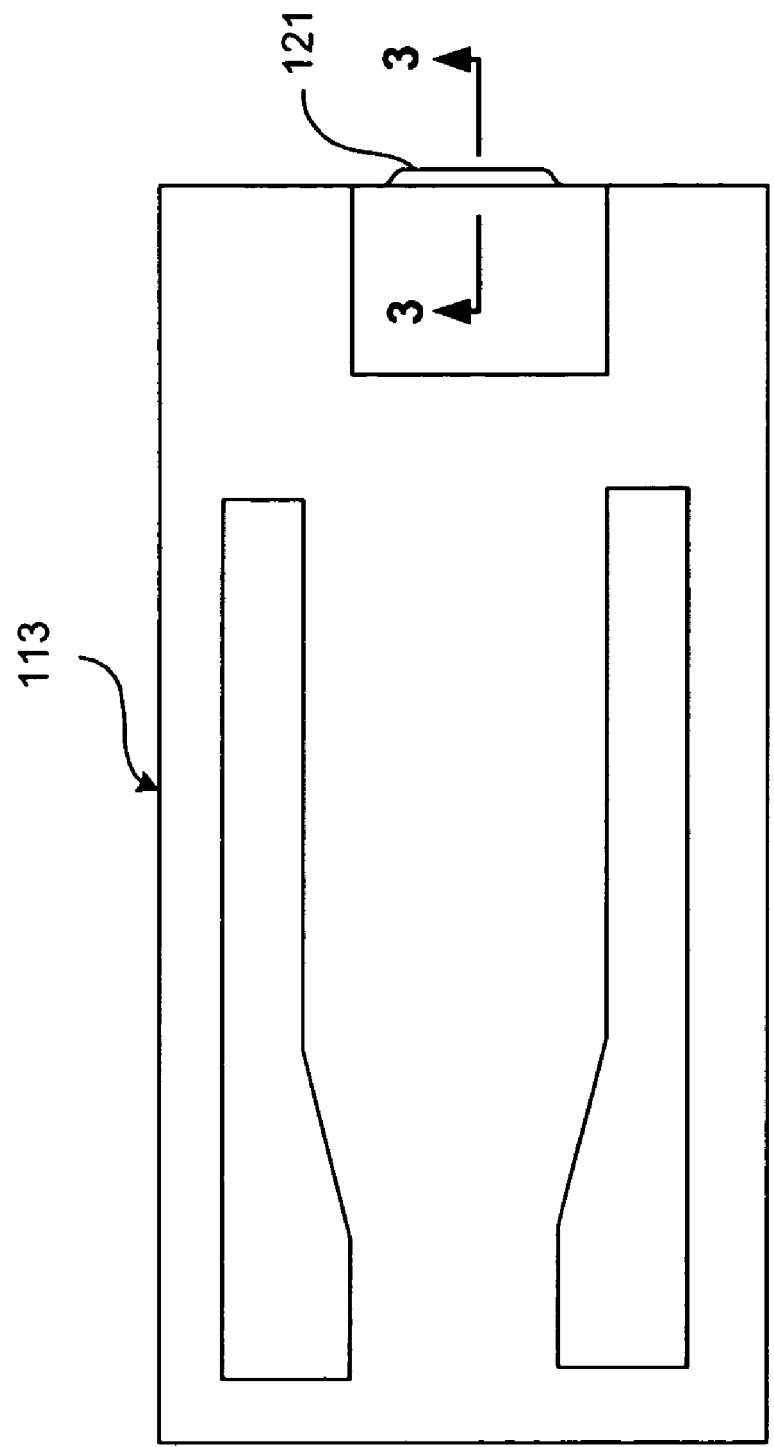
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
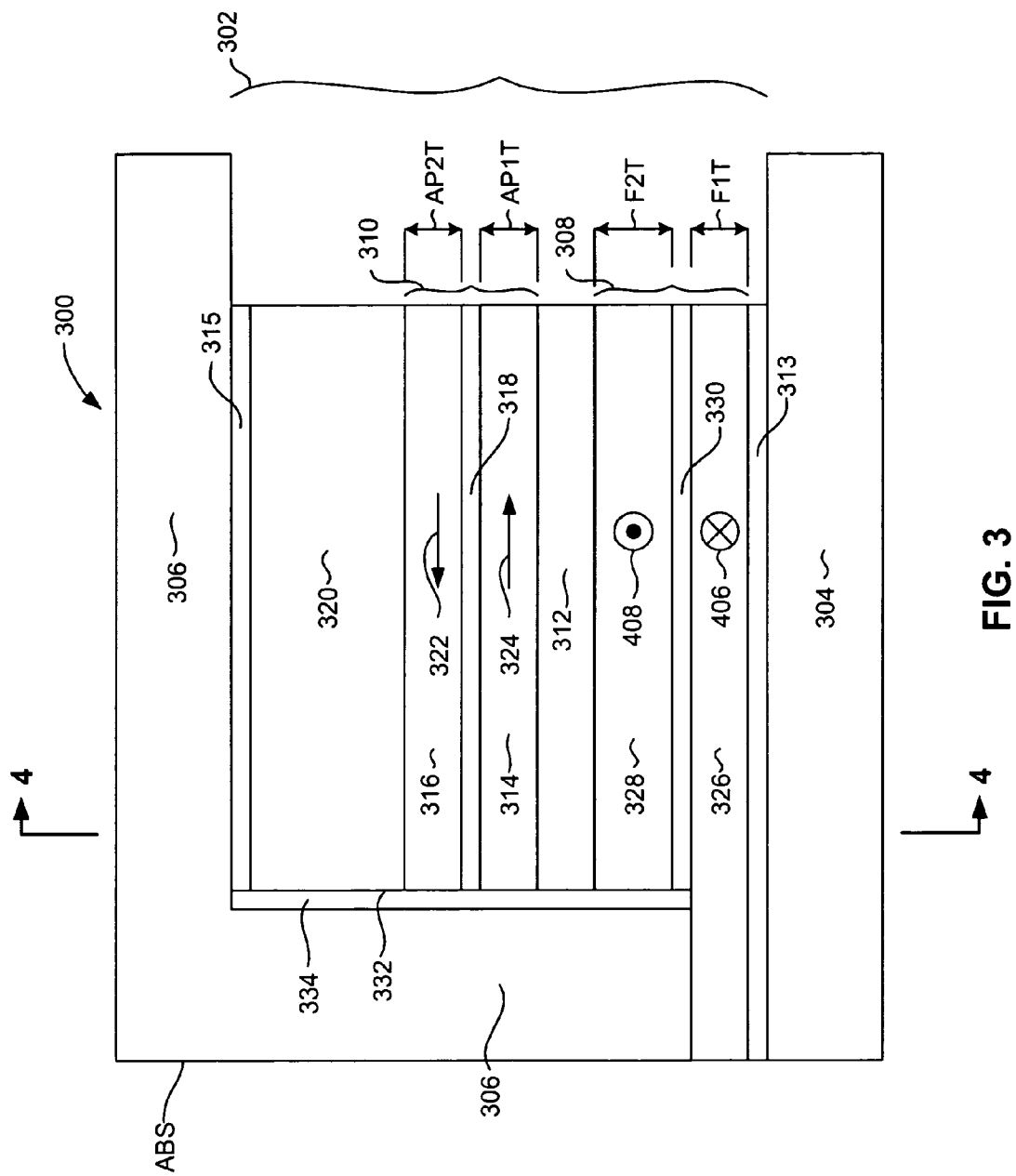
FIG. 3 is an enlarged cross sectional view taken from line 3-3 of FIG. 2.

With reference now to FIG. 3, a cross sectional view of a CPP giant magnetorsistive sensor (CPP GMR) 300 according to an embodiment of the invention is described. The sensor 300 includes a sensor stack 302, which is sandwiched between first and second electrically conductive leads 304, 306 that supply a sense current to the sensor stack 302. The leads 304, 306 can be constructed of a magnetic material such as NiFe so that they function as magnetic shields as well as leads.

The sensor stack 302 includes a free layer 308, pinned layer 310, and a non-magnetic, electrically conductive spacer layer 312 such as Cu sandwiched between the free layer 308 and the pinned layer 310. The sensor stack may also include a seed layer 313 at the bottom of the sensor stack to initiate a desired crystalline growth in the sensor layers. The seed layer 313 can be, for example Ta, Ru or Cu. A capping layer 315, such as Ta, Ru or a combination of these or other materials may be formed at the top of the sensor stack to prevent damage to the layers of the sensor stack 302 during manufacture and also to ensure a good electrical contact between the sensor stack 302 and the lead/shield 306.

The pinned layer 310 may be of several designs such as simple pinned or self pinned (ie. no AFM layer), but is preferably an AP coupled, AFM pinned structure including first and second magnetic layers AP1 314, AP2 316 constructed of a magnetic material such as CoFe. A non-magnetic, AP coupling layer 318 such as Ru is sandwiched between the AP1 and AP2 layers 314, 316. One of the magnetic layers, such as AP2 316 is exchange coupled with a layer of antiferromagnetic material AFM layer 320. The AFM layer can be constructed of, for example PtMn or IrMn, and when exchange coupled with the AP2 layer 316 it strongly pins the magnetization 322 of the AP2 layer 316 in desired direction perpendicular to the ABS. Antiparallel coupling between the AP1 and AP2 layers 314, 316 pins the magnetization 324 of the AP1 layer 314.

The free layer structure 308 is constructed as an antiparallel coupled free layer, which can be referred to as a synthetic free layer 308. The synthetic free layer 308 includes a first magnetic layer F1 326, and a second magnetic layer F2 328. The first and second magnetic layers F1 and F2 are antiparallel coupled across a non-magnetic AP coupling layer 330 which may be Ru having a thickness of about 4 Angstroms. As can be seen in FIG. 3, the one of the magnetic layers 326 of the free layer 308 extends to the ABS, while the other layer 328 is recessed from the ABS. In fact, it can be seen that all of the layers of the sensor stack 302 other than the first magnetic layer 326 of the free layer 308 are recessed from the ABS. All or a portion of the coupling layer 330 may also extend to the ABS.

With continued reference to FIG. 3, it can be seen that the sensor stack 302 has a front edge 332 that is recessed from the front ABS. It can also be seen that the recessed front edge of the sensor stack 302 includes the capping layer 315, pinned layer 310, spacer layer 312, as well as the F2 layer 328 and possibly the coupling layer 330 of the free layer 308. The second shield 306 extends down across the ABS separating the recessed front edge 332 of the sensor stack 308 from the ABS. A layer of electrically insulating material 334 separates the front edge 332 of the sensor stack 302 from the extended portion of the shield 306. The insulation layer can be, for example alumina ($Al_2O_3$) and can be deposited by a conformal deposition method such as chemical vapor deposition, atomic layer deposition, etc.

Figure 4:
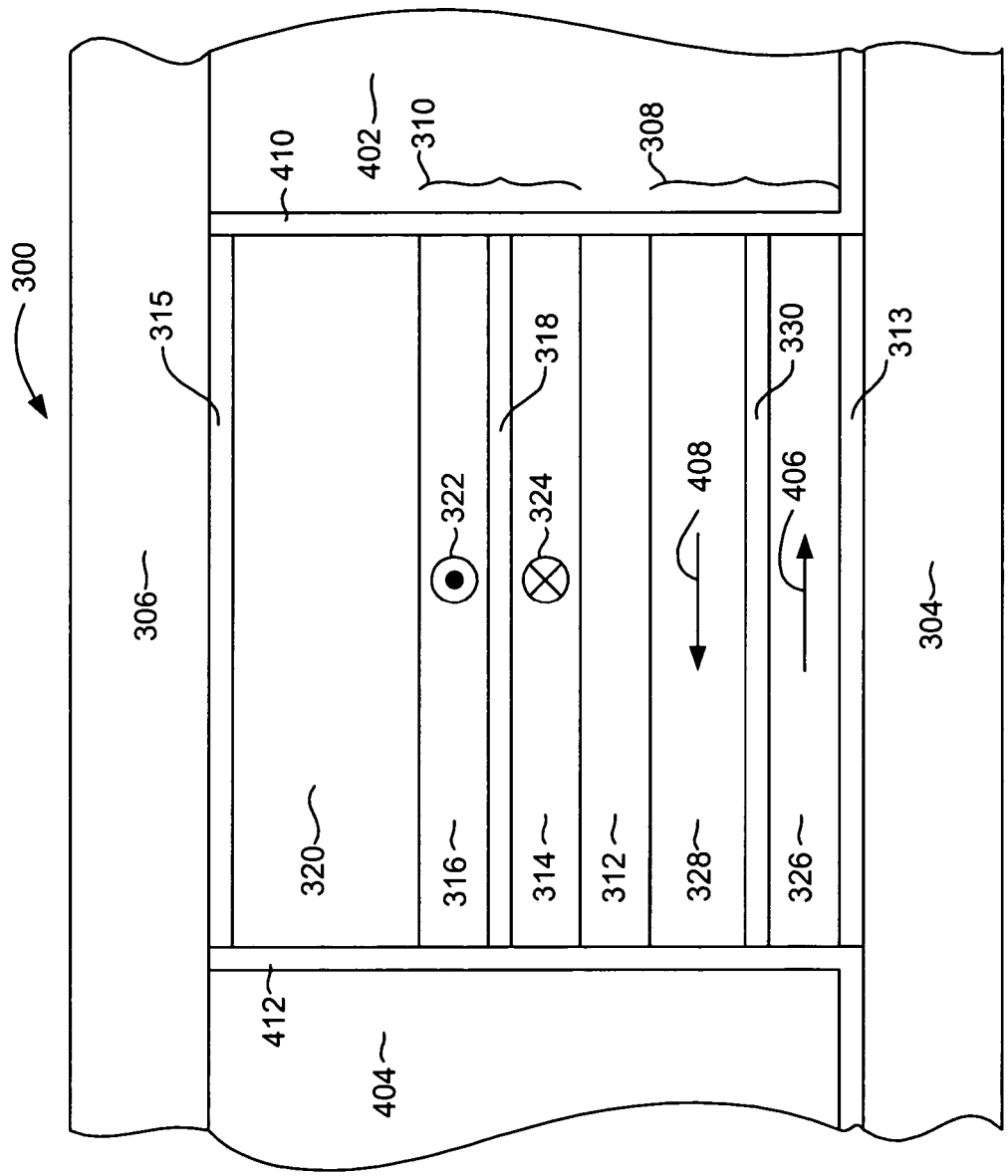
FIG. 4 is a view taken from line 4-4 of FIG. 3.

With reference to FIG. 4, the sensor 300 has first and second hard bias layers 402, 404 that provide a magnetic bias field to bias magnetizations 406, 408 of the free layer 308 in desired directions parallel with the ABS and antiparallel with one another. Thin insulation layers 410, 412 cover the lateral sides of the sensor stack 302, and extend over the first shield 304 to prevent sense current from being shunted through the hard bias layers 402, 404. The insulation layers 410, 412 can be constructed of, for example alumina and can be deposited by a conformal deposition process such as atomic layer deposition or chemical vapor deposition.

With reference again to FIG. 3, the first magnetic layer F1 326 of the free layer 308 extends beyond the front edge 332 of the sensor stack 302 and preferably extends to the ABS. In this way, the F1 layer 326 of the free layer 308 acts as a flux guide that conducts flux from a magnetic medium (not shown). When the F1 layer 326 experiences the presence of a magnetic field, such as from a magnetic medium, its magnetization 406 rotates accordingly. The magnetization 408 of the F2 layer 328 remains antiparallel to the magnetization 406 of the F1 layer 326, thereby also rotating in response to the sensed magnetic field.

The magnetic performance of a magnetoresistive sensor is proportional to the thickness of the magnetic layers of the free and pinned layers that are closest to the spacer layer. This magnetic performance is measured as the change in resistance divided by the nominal or "sheet" resistance (dr/R). This dr/R is determined by the sum of the thicknesses and resistivities of the free and pinned (reference) layers. In the case of the sensor described with reference to FIGS. 3 and 4, dr is determined by $(F2T \times F2R)+(AP1T \times AP1R)$, where F2T and F2R are the thickness and resistivity respectively of the F2 layer 328 and AP1T and AP1R are the thickness and resistivity respectively of the AP1 layer 314. Therefore, as can be seen, in order to increase the magnetic performance of the sensor it would be desirable to increase the thickness of the free layer. However, in a conventional, simple, single layer free layer, increasing the thickness of the free layer lowers the utilization/sensitivity of the free layer so that it becomes insensitive to the presence of a magnetic field (ie. does not rotate in response to a magnetic field). The AP coupled structure of the free layer 308 of the present invention allows the F2 layer to be thicker than would otherwise be possible, because the effective magnetic thickness of the free layer 308 is the difference between the magnetic thicknesses of the F1 and F2 layers 326, 328. The magnetic thickness is defined as the thickness of a magnetic layer multiplied by the magnetization of the layer. Therefore, the AP coupled structure of the free layer 308 allows the F2 layers 326, 328 to be thicker while providing an effective thickness that is thin enough to allow the free layer to remain sensitive to a magnetic field. A synthetic free layer 308 according to the present invention allows F2 328 to be thicker than would otherwise be possible, providing increasing dr, and also allows F1 326 to be thicker for improved flux guide efficiency and lower magnetic noise due to its larger volume and stiffness.

According to an embodiment of the present invention, the F1 and F2 layers can be constructed of Co, CoFe, NiFe or some combination of these or other materials. For example, the F1 and F2 layers can include a layer of Co or CoFe and a layer of NiFe. Alternatively, the flux guide layer F1 326 of the free layer 308 can be constructed of a layer of CoFeX and a layer of NiFe, where X is a material such as B, Si, Nb or Mo. Such a material provides a desirable negative magnetostriction. A negative magnetostriction in a free layer is desirable because a negative magnetostriction, when combined with compressive stresses inherent in sensors, results in a magnetic anistotropy that is oriented parallel to the ABS in the desired direction of free layer biasing. The F1 layer 326 can have a thickness of 30 to 90 Angstroms and the F2 layer 328 can have a thickness of 60 to 120 Angstroms. The net difference between the thicknesses of the F1 and F2 layers 326, 328 can be 20-40 Angstroms or about 30 Angstroms.

Recessing most of the sensor stack 302 from the ABS as shown in FIG. 3 is advantageous in that it prevents shorting across the spacer layer 312. As those skilled in the art will appreciate, the ABS is formed by a lapping operation that removes material until a desired ABS location has been reached. This process can cause smearing of the sensor layers at the ABS. This smearing of the free layer and/or pinned layer material across the ABS causes shorting of sense current, resulting in loss of sensor performance. Recessing all but the F1 layer 326 (and possibly the coupling layer 330) away from the ABS prevents this smear related shorting of sense current, thereby ensuring optimal sensor performance.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A current perpendicular to plane giant magnetoresistive (CPP GMR) sensor having an air bearing surface (ABS), the sensor comprising:
   a free layer having a first magnetic layer (F1) a second magnetic layer (F2) and a non-magnetic coupling layer sandwiched between the F1 and F2 layers;
   a pinned layer; and
   a non-magnetic, electrically conductive spacer layer sandwiched between the free layer and the pinned layer; wherein
   the F1 layer extends to the ABS, and the F2 layer, spacer layer and pinned layer are recessed from the ABS; and
   a magnetic shield extends between the ABS and the F2 layer, spacer layer and the pinned layer.

2. A sensor as in claim 1 wherein the coupling layer of the free layer comprises Ru.

3. A sensor as in claim 1 wherein the pinned layer comprises a third magnetic layer (AP1) a fourth magnetic layer (AP2) and a second non-magnetic coupling layer sandwiched between the AP1 and AP2 layers.

4. A sensor as in claim 1 wherein the F1 and F2 layers comprise CoFe.

5. A sensor as in claim 1 wherein the F1 layer comprises CoFeX wherein X is B, Si, Nb or Mo.

6. A sensor as in claim 1 wherein the F1 layer has a thickness of 30 to 90 Angstroms and the F2 layer has a thickness of 60 to 120 Angstroms.

7. A sensor as in claim 1 wherein F2 is adjacent to the spacer layer.

8. A sensor as in claim 1, further comprising:
   a first electrically conductive lead disposed adjacent to the free layer and a second electrically conducting lead disposed adjacent to the pinned layer, the second lead extending along the ABS to separate the pinned layer from the ABS.

9. A sensor as in claim 8 wherein the lead is constructed of a magnetic material.

10. A sensor as in claim 1, wherein the pinned layer, spacer layer and the F2 layer define a front edge that is recessed from the ABS.

11. A sensor as in claim 10, further comprising:
    a first magnetic, electrically conductive lead disposed adjacent to the free layer;
    a second magnetic, electrically conductive lead disposed adjacent to the pinned layer, the second lead having a portion that extends between the recessed front edge and the ABS; and
    a layer of electrically insulating material disposed between the recessed front edge and the second lead.

12. A sensor as in claim 1, wherein the pinned layer, spacer layer and the F2 layer define a front edge that is recessed from the ABS, the sensor further comprising a layer of electrically insulating material extending across the recessed front edge.

13. A sensor as in claim 1, wherein the pinned layer, spacer layer and the F2 layer define a front edge that is recessed from the ABS.

14. A sensor as in claim 1 wherein the F2 layer has a thickness that is greater than a thickness of the F1 layer and wherein the difference between the thickness of the F2 layer and the F1 layer is 20-40 Angstroms.

15. A sensor as in claim 1 wherein the F2 layer has a thickness that is greater than a thickness of the F1 layer and wherein the difference between the thickness of the F2 layer and the F1 layer is about 30 Angstroms.

16. A current perpendicular to plane giant magnetoresistive (CPP GMR) sensor, comprising:
    a sensor stack having a top surface, a bottom surface opposite the top surface and a front edge that is recessed from an air bearing surface (ABS), the sensor stack including a pinned layer structure, a free layer structure and a non-magnetic, electrically conductive spacer layer sandwiched between the free layer structure and the pinned layer structure, the free layer structure including a first magnetic layer (F1) a second magnetic layer (F2) and a non-magnetic coupling layer sandwiched between the F1 layer and the F2 layer, the F1 layer extending beyond the recessed front edge of the sensor stack;
    a first magnetic, electrically conductive lead electrically connected with the bottom of the sensor stack;
    a second magnetic, electrically conductive lead connected with the top of the sensor stack and extending between the ABS and the F2 layer, spacer layer and the pinned layer, and
    a layer of electrically insulating material extending across the recessed front edge of the sensor stack.

17. A sensor as in claim 16 wherein the F1 layer has a thickness of 30-90 Angstroms and the F2 layer has a thickness of 60 to 120 Angstroms.

18. A sensor as in claim 16, wherein the coupling layer comprises Ru.

19. A sensor as in claim 16 wherein the pinned layer comprises a third magnetic layer (AP1) a fourth magnetic layer (AP2) and a second non-magnetic coupling layer sandwiched between the AP1 and AP2 layers.

20. A sensor as in claim 16 wherein the F1 and F2 layers comprise CoFe.

21. A sensor as in claim 16 wherein the F1 layer comprises CoFeX wherein X is B, Si, Nb or Mo.

22. A sensor as in claim 16 wherein F2 is adjacent to the spacer layer.

23. A sensor as in claim 16 wherein the F2 layer has a thickness that is greater than a thickness of the F1 layer and wherein the difference between the thickness of the F2 layer and the F1 layer is 20-40 Angstroms.

24. A sensor as in claim 16 wherein the F2 layer has a thickness that is greater than a thickness of the F1 layer and wherein the difference between the thickness of the F2 layer and the F1 layer is about 30 Angstroms.

* * * * *

UNITED STATES PATENT AND TRADEMARK OFFICE
CERTIFICATE OF CORRECTION

PATENT NO. : 7,616,411 B2 Page 1 of 1
APPLICATION NO. : 11/392199
DATED : November 10, 2009
INVENTOR(S) : Hardayal Singh Gill It is certified that error appears in the above-identified patent and that said Letters Patent is hereby corrected as shown below:

In claim 16, column 8, line 40, please replace "layer, and" with --layer; and--.

Signed and Sealed this

Eighth Day of June, 2010

David J. Kappos
*Director of the United States Patent and Trademark Office*